Sept. 1, 1964 MITITAKA YAMAMOTO ETAL 3,147,408
PROXIMITY SWITCH SYSTEM
Filed Aug. 7, 1961
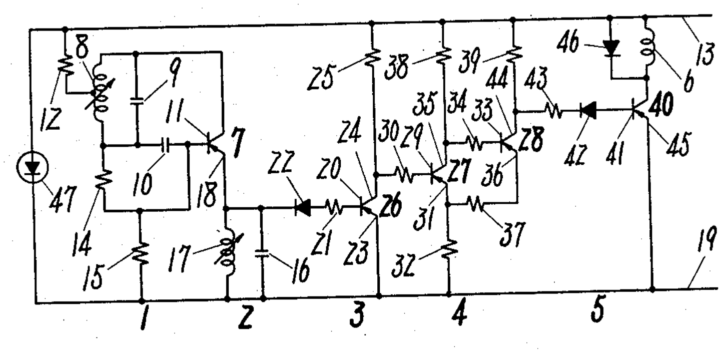
INVENTORS
MITITAKA YAMAMOTO
AKIRA ABE
By Joseph J. Julian
His Attorney 3,147,408
PROXIMITY SWITCH SYSTEM
Mititaka Yamamoto, 17 Gotandacho, Ryuanji, Ukyoku, Kyoto, Japan, and Akira Abe, 62 Myoshinjicho, Hanazono, Ukyoku, Kyoto, Japan
Filed Aug. 7, 1961, Ser. No. 129,878
1 Claim. (Cl. 317—146)

In the proximity switch system described in the pending United States patent application Serial No. 83,124, a high frequency oscillating circuit consisting of a sensor coil and a condenser, is connected with a resonating circuit which oscillates in tune with the normal frequency of said oscillating circuit. And, Schmitt circuit forming a NOT circuit is connected with said resonating circuit through a diode so as to actuate a relay by the output signal from Schmitt circuit when a metallic piece approaches to the sensor coil.

Since this proximity switch system uses a high frequency oscillating circuit, the range of the magnetic field formed by the coil of the oscillating circuit is very wide whereby not only strong magnetic metal such as iron but also those non-magnetic metals such as copper, brass and others would vary sharply the self-inductance of the sensor coil from a comparatively great distance. In general, the approach of any metal would actuate said proximity switch system. Of course, the sensitivity thereof depends on the kind of metals.

In such a proximity switch system, the relay connected with Schmitt circuit should be of high impedance, such as a relay of small type. Therefore, in order to control great amount of electric current for electric motor or others, a power relay of a large capacity should be used in addition to the small type relay, hence it is uneconomical.

Further, should transistors be used throughout this switch system, the repeated uses would heat and dearrange the transistors and the impulse waves produced by Schmitt circuit would vary in their shape whereby the critical distance between the metal piece and the sensor coil would not be maintained constant.

The present invention has for its object to do away with such a defect through introducing a NOT circuit employing a transistor between the resonating circuit and Schmitt circuit, and connecting a power transistor with Schmitt circuit through a diode so as to actuate the power relay by the output signals issued by the power transistor.

Now, the present invention will be explained in reference with the accompanying drawing showing the circuit diagram of the proximity switch system.

The proximity switch system according to this invention comprises a high frequency oscillating circuit 1, a parallel resonating circuit 2, a NOT circuit 3, Schmitt circuit 4, an amplifying circuit 5 and a relay 6—transistors being used throughout the circuits.

The high frequency oscillating circuit 1 is of a Hartley type using a transistor 7. 8 is a sensor coil. A resonating circuit 2 consisting of said sensor coil and a condenser 10 is connected with the collector circuit of the transistor and fed back to the base 11 through a condensor 10. The middle point of the coil 8 is connected with the negative electric source 13 through a resistance 12. 14 and 15 are bias resistances. The negative potential apportion by said bias resistances is fed to the base 11 and decides the acting condition of the transistor 7. The frequency of the high frequency oscillating circuit 1 is substantially in tune with the resonating circuit 2. Since L and C of the high frequency oscillating circuit being chosen very small, the frequency is very high, for example, in the degree of 1000 kc. The resonating circuit 2 consists of a condenser 16 and a coil 17 of the dust core type connected in parallel. Said condenser and coil are so chosen that the circuit 2 can oscillate in tune with the oscillating circuit 1. The resonating circuit 2 is connected with the emitter 18 of the transistor 7 as well as with the positive electric source 19. The coil 17 is so adjusted that the resonating circuit 2 can oscillate in tune with the normal frequency of the oscillating circuit 1. The circuits thus far explained are substantially equal to those of the proximity switch system mentioned in the pending United States patent application Serial No. 83,124.

The NOT circuit 3 is provided with a transistor 26, the base 20 of which being connected with the emitter 18 of the transistor 7 through a base resistance 21 and diode 22, the emitter 23 being earthed and the collector 24 being connected with the negative electric source 13 through a load resistance 25. The diode 22 is so positioned as to cut off the positive input.

Schmitt circuit 4 is provided with transistors 27 and 28. The base 29 of the first transistor 27 is connected with the collector 24 of the transistor 26 through a base resistance 30 and the emitter 31 is earthed through an emitter resistance 32. The base 33 of the second transistor 28 is connected with the collector 35 of the first transistor and its emitter 36 is connected with the emitter 31 of the first transistor 27 through a resistance 37. 38 and 39 are collector load resistances of the transistors 27 and 28, respectively.

The amplifying circuit 5 is provided with a power transistor 40, the base 41 of which being connected with the collector 44 of the second transistor 28 of Schmitt circuit 4 through a diode 42 and a resistance 43 while its emitter 45 being earthed. The diode 42 is provided so as to avoid the burnt-out of the transistor 40 due to the feeding of positive signal to the base 41. The power relay 6 is connected with the collector circuit of the transistor 40. A diode 46 is provided for avoiding the bad effects on the power transistor 40 due to transient voltages which might occur at both ends of the relay. 47 denotes a Zener diode for stabilizing voltages.

The function of this proximity system is as follows:

Since the resonating circuit 2 is in tune with the normal frequency of the high frequency oscillating circuit 1, negative potential is applied to the base 20 of the transistor 26 of the NOT circuit 3 so that the transistor 26 is in the state of "On." Therefore, the first transistor 27 of Schmitt circuit 4 is in the state of "Off" while the second transistor 28 is in the state of "On." Hence, no input signal is fed to the power transistor 40, the power relay 6 does not function.

However, when a metal piece approaches sufficiently near the sensor coil 8, the resonance gain will decrease suddenly whereby the transistor 26 will become "Off" and the output signal which was converted to rectangular wave by Schmitt circuit 4 will actuate the power relay 6 after being amplified by the power transistor 40.

In the previous proximity switch system mentioned in the pending United States Patent application Serial No. 83,124, Schmitt circuit having two transistors is connected with the oscillating circuit and the output signal from said Schmitt circuit actuates the relay. Such an arrangement has the following disadvantages, viz, by repeated uses, the collector current will increase due to overheating of the transistors, whereby the first transistor of Schmitt circuit will not be easily change from "On" to "Off," the relay will not act properly and the critical distance between the metal piece and the sensor coil will be much shortened. In other words, in such a proximity switch system, the time interval from one use to another will control the critical distance, hence the critical distance would not be maintained constant.

When the transistors are heated by repeated uses and when the collector current of the transistor of the NOT circuit increases due to the decrease of gain by the approach of the metal piece to the sensor coil, the conversion from "On" to "Off" or from "Off" to "On" of the transistor of the NOT circuit becomes difficult, but at the same time, as the conversion of the first transistor of Schmitt circuit becomes easy, both compensate with each other whereby the input signal entering into the second transistor of Schmitt would not be influenced badly as shown in the previous proximity switch system. Further, as the input signals to the second transistor are amended to nearly rectangular shape, the difficulty of the conversion due to the increase of the collector current would not occur. Therefore, repeated uses would not alter the output signals of Schmitt circuit or input signals to the amplifying circuit whereby the function of the power relay would be stabilized. At the same time, as the NOT circuit acts to amplify the input signals, the range of input signal change is so wide that the sensitivity of the proximity switch can be promoted exceedingly.

What we claim:

Proximity switch system comprising a high frequency oscillating circuit wherein a sensor coil and a condenser are connected in parallel, a resonating circuit in tune with the normal frequency of the high frequency oscillating circuit and inserted between the emitter of the transistor of the high frequency oscillating circuit and the positive electric source, a NOT circuit employing a transistor and connected with the resonating circuit through a diode which is connected with the emitter of the transistor of the high frequency oscillating circuit, Schmitt circuit having two transistors, an amplifying circuit using a power transistor and connected with Schmitt circuit through a diode, and a power relay which is actuated by the output signals of said amplifying circuit.

References Cited in the file of this patent

UNITED STATES PATENTS

| | | |
|---|---|---|
| 2,590,826 | Schenck | Mar. 25, 1952 |
| 2,806,181 | Rockafellow | Sept. 10, 1957 |
| 2,848,658 | Mitchell | Aug. 19, 1958 |
| 2,907,931 | Moore | Oct. 6, 1959 |
| 2,954,479 | Cibelius | Sept. 27, 1960 |
| 3,015,077 | Elam et al. | Dec. 26, 1961 |
| 3,042,839 | Hermes | July 3, 1962 |